United States Patent
Lee et al.

(10) Patent No.: US 9,065,491 B2
(45) Date of Patent: Jun. 23, 2015

(54) ADJUSTING PHASE IMBALANCE BETWEEN IN-PHASE (I) AND QUADRATURE-PHASE (Q) SIGNALS

(71) Applicant: QUALCOMM Incorporated, San Diego, CA (US)

(72) Inventors: Cheol-Woong Lee, Hayward, CA (US); Saihua Lin, Santa Clara, CA (US); Roger Brockenbrough, Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/791,605

(22) Filed: Mar. 8, 2013

(65) Prior Publication Data

US 2014/0179245 A1    Jun. 26, 2014

Related U.S. Application Data

(60) Provisional application No. 61/745,139, filed on Dec. 21, 2012.

(51) Int. Cl.
*H04B 1/04* (2006.01)
*H04B 1/10* (2006.01)
*H04B 1/02* (2006.01)
(Continued)

(52) U.S. Cl.
CPC ............... *H04B 1/02* (2013.01); *H03D 3/009* (2013.01); *H04L 27/364* (2013.01); *H04L 27/3863* (2013.01); *H03C 2200/0058* (2013.01); *H03D 2200/0045* (2013.01); *H03D 2200/0082* (2013.01); *H03C 2200/0041* (2013.01)

(58) Field of Classification Search
USPC .............. 455/313, 318, 319, 323, 333, 114.2, 455/115.1, 226.1, 255, 256, 257, 296, 305
See application file for complete search history.

(56) References Cited

U.S. PATENT DOCUMENTS 7,831,215 B2 * 11/2010 Park et al. ................. 455/88
8,014,366 B2    9/2011 Wax et al.
(Continued)

FOREIGN PATENT DOCUMENTS

WO    2012100226 A1    7/2012

OTHER PUBLICATIONS

Windisch, et al, "Adaptive I/Q Imbalance Compensation in Low-IF Transmitter Architectures", 2004 IEEE Vehicular Technology Conference, vol. 3, 5 pp.
(Continued)

*Primary Examiner* — Blane J Jackson
(74) *Attorney, Agent, or Firm* — Eric Ho

(57) ABSTRACT

In a particular embodiment, a method of generating in-phase (I) and quadrature-phase (Q) signals includes generating a first I output signal based on a first I input signal, a second I input signal, a first Q input signal, and a second Q input signal. The method further includes generating a second I output signal based on the first I input signal, the second I input signal, the first Q input signal, and the second Q input signal. A first Q output signal is generated based on the first I input signal, the second I input signal, the first Q input signal, and the second Q input signal. A second Q output signal is generated based on the first I input signal, the second I input signal, the first Q input signal, and the second Q input signal. According to further embodiments, an apparatus is disclosed.

9 Claims, 6 Drawing Sheets

(51) Int. Cl.
 *H03D 3/00* (2006.01)
 *H04L 27/36* (2006.01)
 *H04L 27/38* (2006.01)

(56) References Cited

U.S. PATENT DOCUMENTS

| | | | |
|---|---|---|---|
| 8,045,944 B2 | 10/2011 | Zhuo et al. | |
| 8,238,865 B2 | 8/2012 | Chanca et al. | |
| 8,619,916 B2* | 12/2013 | Jong | 375/322 |
| 2009/0088117 A1* | 4/2009 | Hsu et al. | 455/307 |
| 2009/0088120 A1* | 4/2009 | Ling et al. | 455/314 |
| 2009/0131006 A1* | 5/2009 | Wu | 455/257 |
| 2009/0154595 A1* | 6/2009 | Choksi et al. | 375/295 |
| 2009/0302925 A1 | 12/2009 | Oishi et al. | |
| 2010/0045404 A1 | 2/2010 | Bagheri et al. | |
| 2010/0195706 A1* | 8/2010 | Yanagisawa et al. | 375/226 |
| 2011/0292978 A1* | 12/2011 | Kravitz | 375/221 |
| 2012/0187994 A1 | 7/2012 | Yang et al. | |
| 2012/0263215 A1* | 10/2012 | Peng | 375/221 |

OTHER PUBLICATIONS

Smith III, Julius O., "In-Phase & Quadrature Sinusoidal Components", Center for Computer Research in Music and Acoustics (CCRMA), 2007, viewed on Dec. 19, 2012 at https://ccrma.stanford.edu/~jos/st/In_Phase_Quadrature_Sinusoidal.html, 2 pp.
International Search Report and Written Opinion—PCT/US2013/077085—ISA/EPO—Jun. 13, 2014.

* cited by examiner

ADJUSTING PHASE IMBALANCE BETWEEN IN-PHASE (I) AND QUADRATURE-PHASE (Q) SIGNALS

I. CROSS-REFERENCE TO RELATED APPLICATIONS

The present application claims priority from U.S. Provisional Patent Application No. 61/745,139, filed Dec. 21, 2012, the content of which is expressly incorporated herein by reference in its entirety.

II. FIELD

The present disclosure is generally related to electronic devices and more particularly to electronic devices that utilize in-phase (I) and quadrature-phase (Q) signals.

III. DESCRIPTION OF RELATED ART

Advances in technology have resulted in smaller and more powerful computing devices. For example, there currently exist a variety of electronic devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. Electronic devices, such as wireless devices, can therefore include significant computing capabilities.

Wireless devices may send and receive data using radio frequency (RF) signals. The wireless devices may process the data in a baseband domain (e.g., using signals having fewer high frequency components than the RF signals). Consumers increasingly expect such wireless devices to rapidly transfer large amounts of data. However, baseband electronics components of the electronic devices may not be configured to efficiently process such large amounts of data. Further, increasing the processing speed of the baseband electronics components to accommodate the increased amount of data may result in increased power consumption of the electronic devices.

IV. SUMMARY

In a particular embodiment, a device in accordance with the present disclosure calibrates in-phase (I) and quadrature-phase (Q) components (e.g., compensates for I and Q components not exhibiting a 90° phase relation) in the analog domain. Calibrating the I and Q components in the analog domain instead of in the digital domain may free processing resources (e.g., a baseband processor operating in the digital domain) to perform other operations. In a particular example, I and Q calibration in the analog domain includes adjusting magnitudes of currents associated with the I and Q components. Accordingly, a device in accordance with the present disclosure (e.g., a residual sideband (RSB) correction circuit) may enable power-efficient and accelerated baseband performance (e.g., baseband processing using a bandwidth of approximately 1-2 gigahertz) while still effectively calibrating I and Q components of received signals having a high frequency (e.g., approximately 60 gigahertz). In at least one embodiment, the device is compliant with an Institute of Electrical and Electronics Engineers (IEEE) 802.11 ad communication protocol.

In another particular embodiment, a method of generating in-phase (I) and quadrature-phase (Q) signals includes generating a first I output signal based on a first I input signal, a second I input signal, a first Q input signal, and a second Q input signal. The method further includes generating a second I output signal based on the first I input signal, the second I input signal, the first Q input signal, and the second Q input signal. A first Q output signal is generated based on the first I input signal, the second I input signal, the first Q input signal, and the second Q input signal. A second Q output signal is generated based on the first I input signal, the second I input signal, the first Q input signal, and the second Q input signal.

In another particular embodiment, an apparatus includes an in-phase (I) input node configured to receive an I input signal. The apparatus further includes a first transistor having a first size and a second transistor having a second size different than the first size. The first transistor and the second transistor are coupled to the I input node. One or more of the first transistor and the second transistor are activated to balance the I input signal with respect to a quadrature-phase (Q) input signal.

In another particular embodiment, an apparatus includes means for allocating a first in-phase (I) input signal between a first I output node and a second I output node. The apparatus further includes means for allocating a second I input signal between the first I output node and the second I output node. The apparatus further includes means for allocating a first quadrature-phase (Q) input signal between a first Q output node and a second Q output node and means for allocating a second Q input signal between the first Q output node and the second Q output node.

In another particular embodiment, a computer-readable storage medium stores instructions. The instructions are executable by a processor to cause the processor to generate a first in-phase (I) input signal, a second I input signal, a first quadrature-phase (Q) input signal, and a second Q input signal. The instructions are further executable by the processor to provide the first I input signal, the second I input signal, the first Q input signal, and the second Q input signal to a radio frequency (RF) interface. The RF interface generates a first I output signal based on the first I input signal, the second I input signal, the first Q input signal, and the second Q input signal. The RF interface further generates a second I output signal based on the first I input signal, the second I input signal, the first Q input signal, and the second Q input signal. The RF interface further generates a first Q output signal based on the first I input signal, the second I input signal, the first Q input signal, and the second Q input signal. The RF interface further generates a second Q output signal based on the first I input signal, the second I input signal, the first Q input signal, and the second Q input signal.

One particular advantage provided by at least one of the disclosed embodiments is that I and Q components may be calibrated in the analog domain instead of in the digital domain. In at least one embodiment, calibrating the I and Q components in the analog domain frees processing resources (e.g., a baseband processor operating in the digital domain) to perform other operations. Other aspects, advantages, and features of the present disclosure will become apparent after

V. BRIEF DESCRIPTION OF THE DRAWINGS

VI. DETAILED DESCRIPTION

Figure 1:
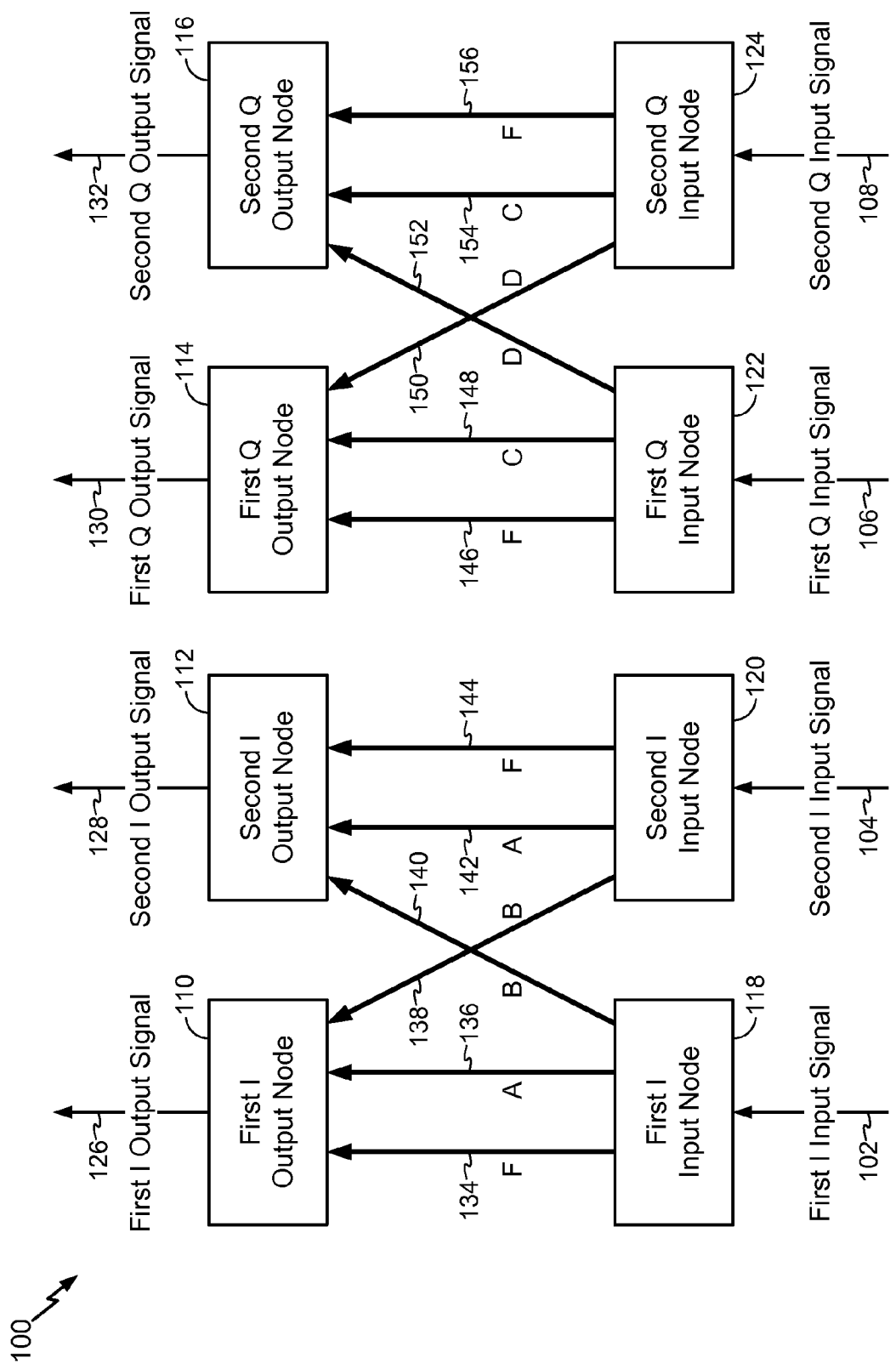
FIG. 1 depicts a block diagram illustrating example aspects of an analog correction circuit.

Electronic devices may communicate using signals that may include, or may be represented by, sinusoid components. For example, a signal to be transmitted may be mathematically expressed as a sum of a sine function component and a cosine function component that are 90° out of phase. The sine and cosine function components may be referred to as in-phase (I) and quadrature-phase (Q) components of the signal. Some communication and processing techniques resolve a signal into I and Q components. For example, modulation techniques for wireless devices may encode information separately using the I and Q components.

Depending on a particular implementation, a problem may arise where the I and Q components are not exactly 90° out of phase. For example, due to physical properties of circuit components (e.g., process variations associated with analog circuit components in a radio frequency (RF) stage of a communication device) that generate the I and Q components, the I and Q components may be not exhibit an ideal 90° phase relation (e.g., I and Q may be 89° out of phase or 91° out of phase, etc.). Noise (e.g., thermal noise) may also degrade the I-Q phase relation. Depending on the application, such phase relation degradation is generally undesirable and can lead to spurious signals or undesired image signals (which may require use of a costly image rejection filter). In the context of wireless communication devices, the phase relation degradation may be further compounded at a radio frequency (RF) mixing stage, potentially preventing a receiver from correctly receiving such signals or requiring an increased transmit power to communicate information. Accordingly, a proper phase relationship for 1 and Q signals is important for enabling robust wireless communication techniques.

Some devices utilize correction circuits to adjust (e.g., balance) the phase relationship of the I and Q components to be 90° out of phase. Such correction circuits may be implemented using digital circuitry (e.g., circuitry of a digital baseband processor). For example, a baseband processor may use a digital "pre-distortion" technique to "pre-compensate" for a predicted I-Q phase imbalance of transmission signals. However, pre-compensating for such I-Q phase imbalances may be computationally difficult. Further, in some applications, digital implementation of the correction circuit may be inefficient. For example, for wireless applications that utilize high radio frequencies, such as radio frequencies of approximately 60 gigahertz (GHz), digital phase correction of the I and Q components is resource-intensive.

In accordance with at least one embodiment of the present disclosure, I and Q components associated with relative phase imbalances $I_{imb}$ and $Q_{imb}$ are corrected (e.g., phase-corrected to have approximately a 90° phase relation) according to an analog processing technique, by an analog correction circuit, or a combination thereof. For example, the phase imbalances $I_{imb}$ and $Q_{imb}$ may be given by:

$$I_{imb} = \left(1 + \frac{dr}{2}\right)\cos\left(\omega t + \frac{d\phi}{2}\right)I$$

$$Q_{imb} = \left(1 - \frac{dr}{2}\right)\sin\left(\omega t - \frac{d\phi}{2}\right)Q$$

where ω indicates angular frequency, where t indicates time, where dr/2 indicates an incremental change d in a radius r (e.g., a magnitude) divided by two, where dϕ/2 indicates an incremental change d in an angle ϕ (e.g., a phase) divided by two, and where the angle ϕ0 is expressed in radians.

In at least one embodiment, a calibration matrix is applied to the I and Q input signals according to an analog processing technique to generate calibrated I and Q output signals. The calibration matrix may be given by:

$$\begin{bmatrix} \cos\frac{d\phi}{2} \frac{1}{1+dr/2} & \sin\frac{d\phi}{2} \frac{1}{1+dr/2} \\ \sin\frac{d\phi}{2} \frac{1}{1-dr/2} & \cos\frac{d\phi}{2} \frac{1}{1-dr/2} \end{bmatrix}$$

After calibration, the calibrated I and Q signals may be mixed and transmitted (e.g., a signal may be transmitted by device, such as a wireless device). The signal may be received by another device, which may recover the information encoded using the I and Q signals.

Referring to FIG. 1, a block diagram illustrating an analog correction circuit, and certain aspects thereof, is depicted and generally designated 100. In a particular embodiment, the aspects described with reference to FIG. 1 may be implemented in a transceiver of a radio-frequency (RF) device that utilizes in-phase (I) and quadrature-phase (Q) signals, such as an RF device in a high-speed local area network (LAN) component that utilizes a 60 gigahertz (GHz) frequency spectrum. The aspects of the analog correction circuit described with reference to FIG. 1 may correct or reduce phase imbalances associated with I and Q signal components, as described further below. The phase imbalances may be corrected at least in part using analog circuitry and according to an analog processing technique, as described further below.

FIG. 1 depicts a first in-phase (I) input node 118, a second I input node 120, a first quadrature-phase (Q) input node 122, a second Q input node 124, a first I output node 110, a second I output node 112, a first Q output node 114, and a second Q output node 116. In at least one embodiment, the first I input node 118 and the second I input node 120 correspond to a differential I input, the first Q input node 122 and the second Q input node 124 correspond to a differential Q input, the first I output node 110 and the second I output node 112 correspond to a differential I output, and the first Q output node 114 and the second Q output node 116 correspond to a differential Q output.

In operation, a first I input signal 102 is allocated between the first I output node 110 and the second I output node 112. The first I output node 110 generates a first I output signal 126. A second I input signal 104 is allocated between the first I output node 110 and the second I output node 112. The second I output node 112 generates a second I output signal 128. Specifically, in the example of FIG. 1, a first portion 136 of the first I input signal 102 is allocated to the first I output node 110 and a second portion 140 of the first I input signal 102 is allocated to the second I output node 112. A first portion 138 of the second I input signal 104 may be allocated to the first I output node 110 and a second portion 142 of the second I input signal 104 may be allocated to the second I output node 112.

FIG. 1 further depicts that a first Q input signal 106 and a second Q input signal 108 are each allocated between the first Q output node 114 and the second Q output node 116 to generate a first Q output signal 130 and a second Q output signal 132, respectively. For example, portions 148, 152 of the first Q input signal 106 and portions 150, 154 of the second Q input signal 108 may be allocated between the Q output nodes 114, 116.

As depicted in FIG. 1, the portions 134, 144, 146, and 156 may be "fixed" or "constant" portions. For example, in at least some applications, I and Q portions are not expected to be 100% imbalanced. Accordingly, in at least one embodiment, if a relative phase imbalance associated with the first I input signal 102 (e.g., as compared to the first Q input signal 106) is not expected to exceed 20%, then the "fixed" portion 134 may allocate 80% of the first I input signal 102 to the first I output node 110. The remaining 20% may be allocated between the I output nodes 110, 112 to correct the relative phase imbalance associated with the first I input signal 102. Example allocations of I and Q input signals are described further with reference to FIG. 3.

FIG. 1 illustrates a first balance condition that may specify a first technique for balancing the input signals 102, 104, 106, 108 to generate the output signals 126, 128, 130, 132. Calibrating the input signals 102, 104, 106, 108 according to the first balance condition compensates for phase imbalances caused by "mismatched" circuitry, such as due to process or temperature variations, as well as other causes of phase imbalance. For example, in FIG. 1, portions 136 and 142 are each designated "A," portions 138 and 140 are each designated "B," portions 148 and 154 are each designated "C," and portions 150 and 152 are each designated "D." In FIG. 1, the first balance condition may specify that A+B=C+D. Accordingly, in the example of FIG. 1, the first balance condition may specify that allocating the first I input signal 102 and the second I input signal 104 to the first I output node 110 and the second I output node 112 is balanced with respect to allocating the first Q input signal 106 and the second Q input signal 108 to the first Q output node 114 and the second Q output node 116.

Figure 2:
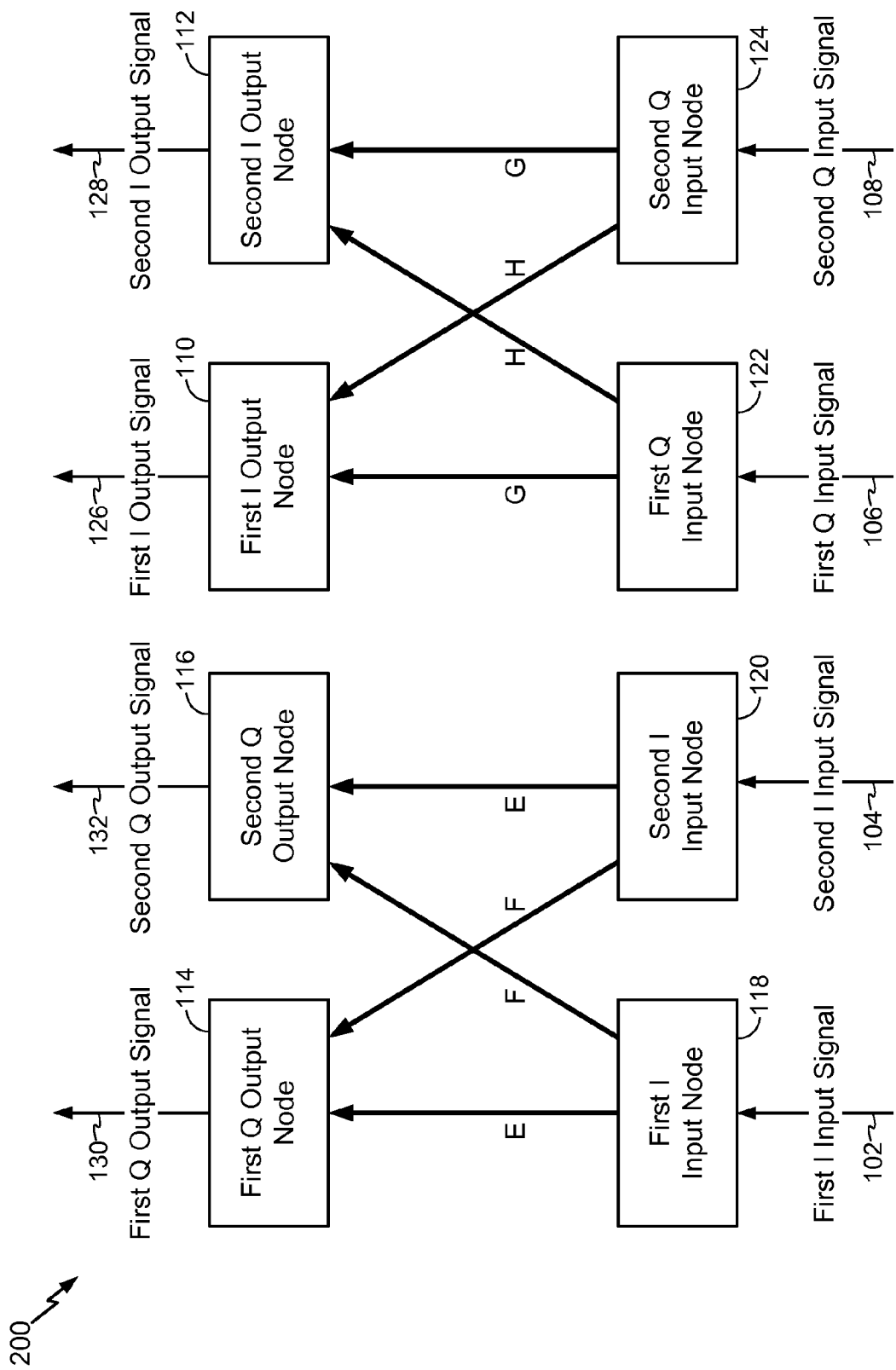
FIG. 2 depicts a block diagram illustrating additional example aspects of an analog correction circuit.

Referring to FIG. 2, a block diagram illustrating additional example aspects of an analog correction circuit is depicted and generally designated 200. In the example of FIG. 2, I input signals are allocated between Q output nodes and Q input signals are allocated between I output nodes. For example, FIG. 2 depicts that the I input signals 102, 104 may be allocated between the Q output nodes 114, 116 to generate the Q output signals 130, 132, and the Q input signals 106, 108 may be allocated between the I output nodes 110, 112 to generate the I output signals 126, 128.

In a particular embodiment, FIG. 2 illustrates a second balance condition where E+F=G+H. Accordingly, the second balance condition may specify that allocating the first I input signal 102 and the second I input signal 104 to the first Q output node 114 and the second Q output node 116 is balanced with respect to allocating the first Q input signal 106 and the second Q input signal 108 to the first I output node 110 and the second I output node 112.

FIGS. 1 and 2 therefore illustrate balance conditions that may be utilized to calibrate I and Q signals (e.g., the input signals 102, 104, 106, and 108). I and Q input signals, such as the input signals 102, 104, 106, 108, may be calibrated based on the balance conditions to correct a relative phase imbalance between the I and Q input signals. In at least one embodiment, the balance conditions described with reference to FIGS. 1 and 2 correspond to direct current (DC) balance conditions that, when satisfied, enable alternating current (AC) balance between I and Q signals, such as the input signals 102, 104, 106, 108. Further, because DC balance conditions can be satisfied in certain applications more easily than AC balance conditions (e.g., by using analog circuitry to add and/or subtract DC signals), using DC balance conditions to enable AC balance may be simplified as compared to designs that utilize complicated circuits to directly enable AC balance. For example, by ensuring DC balance of the I and Q signals using an analog processing technique, AC balance of signals to be transmitted based on the I and Q signals may be achieved even at high carrier frequencies (e.g., approximately 60 GHz). Calibrating the I and Q input signals based on the balance conditions may be performed in the analog domain and according to an analog processing technique, as described further with reference to FIG. 3.

Figure 3:
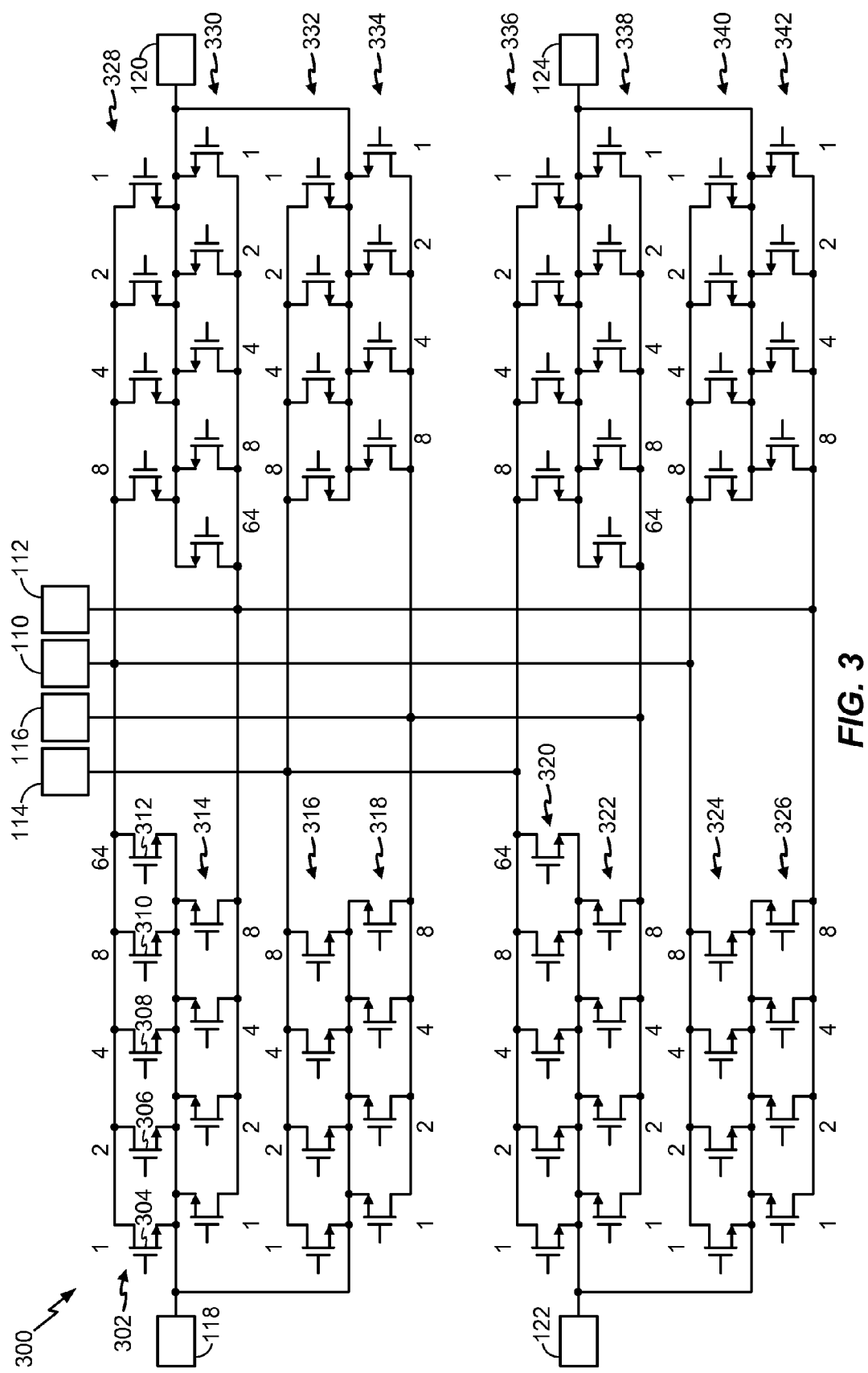
FIG. 3 is a diagram of a particular illustrative embodiment of an analog correction circuit that implements aspects described with reference to FIGS. 1 and 2.

Referring to FIG. 3, a particular illustrative embodiment of an analog correction circuit (e.g., a residual sideband (RSB) suppression circuit) is depicted and generally designated 300. In at least one embodiment, the analog correction circuit 300 of FIG. 3 compensates for a relative phase imbalance associated with I and Q signal components prior to a mixer stage of a transmitter, as described further with reference to FIG. 4. According to further embodiments, the analog correct circuit 300 may be utilized in other applications, such as at a receiver to balance I-Q signal components of a received signal.

Certain components and operations of the analog correction circuit 300 may be described with reference to FIGS. 1 and 2. For example, the analog correction circuit 300 includes the first I input node 118, the second I input node 120, the first Q input node 122, the second Q input node 124, the first I output node 110, the second I output node 112, the first Q output node 114, and the second Q output node 116. The input nodes 118, 120, 122, 124 may be responsive to the input signals 102, 104, 106, 108, respectively. The output nodes 110, 112, 114, 116 may generate the output signals 126, 128, 130, 132, respectively. FIG. 3 further depicts that the aspects described with reference to FIGS. 1 and 2 may be implemented in a circuit, such as the analog correction circuit 300. For example, operation of the analog correction circuit 300 of FIG. 3 may satisfy the balance conditions described with reference to FIGS. 1 and 2. Accordingly, the analog correction circuit 300 of FIG. 3 may correspond to a particular implementation of the aspects described with reference to FIGS. 1 and 2.

In the particular example of FIG. 3, the analog correction circuit 300 includes transistors coupled between the input nodes 118, 120, 122, 124 and the output nodes 110, 112, 114, 116. For example, in FIG. 3, the analog correction circuit 300 includes a first plurality of transistors 302. The first plurality of transistors 302 includes a first transistor 304, a second transistor 306, a third transistor 308, a fourth transistor 310, and a fifth transistor 312. As illustrated in FIG. 3, each transistor of the first plurality of transistors 302 is coupled between the first I input node 118 and the first I output node 110. Further, in the particular example of FIG. 3, the first plurality of transistors 302 includes a plurality of n-type metal-oxide-semiconductor field-effect transistors (nMOS-FETs) each having a respective source terminal coupled to the first I input node 118 and each having a respective drain terminal coupled to the first I output node 110.

The analog correction circuit 300 may further include a second plurality of transistors 314 coupled between the first I input node 118 and the second I output node 112, a third plurality of transistors 316 coupled between the first I input node 118 and the first Q output node 114, and a fourth plurality of transistors 318 coupled between the first I input node 118 and the second Q output node 116. FIG. 3 depicts that a fifth plurality of transistors 320, a sixth plurality of transistors 322, a seventh plurality of transistors 324, and an eighth plurality of transistors 326 may be coupled between the first Q input node 122 and the output nodes 114, 116, 110, 112, respectively. In addition, a ninth plurality of transistors 328, a tenth plurality of transistors 330, an eleventh plurality of transistors 332, and a twelfth plurality of transistors 334 may be coupled between the second I input node 120 and the output nodes 110, 112, 114, 116, respectively. Further, a thirteenth plurality of transistors 336, a fourteenth plurality of transistors 338, a fifteenth plurality of transistors 340, and a sixteenth plurality of transistors 342 may be coupled between the second Q input node 124 and the output nodes 114, 116, 110, 112, respectively.

In FIG. 3, each of the transistors is depicted with a particular number (1, 2, 4, 8, or 64) that may indicate a scale (e.g., size, such as width) of the transistor as compared to other transistors illustrated in FIG. 3. For example, in a particular embodiment, the size of a transistor indicated by a "4" (e.g., the third transistor 308) may be approximately twice the size of a transistor indicated by a "2" (e.g., the second transistor 306) and approximately four times the size of a transistor indicated by a "1" (e.g., the first transistor 304). The third transistor 308 thus may pass (e.g., allocate or "steer") approximately twice and four times as much current as the second transistor 306 and the first transistor 304, respectively, when gated by a suitable control signal (omitted from FIG. 3 for clarity of illustration). As another example, the size of the third transistor 308 may be approximately half the size of a transistor indicated by an "8" (e.g., the fourth transistor 310), and may therefore pass approximately half as much current as the fourth transistor 310. In at least one embodiment, the transistor scales indicated in FIG. 3 indicate an approximate physical transistor size, such as an approximate transistor width in micrometers (μm) (e.g., the first transistor 304 may have a width of approximately 1 μm). According to other embodiments, the transistor scales indicated in FIG. 3 are relative sizes and do not indicate an approximate physical size in μm. Further, it should be appreciated that the example of FIG. 3 is illustrative and that other configurations of the analog correction circuit 300 (e.g., the size and number of transistors) are within the scope of the disclosure and may depend on the particular application.

In the particular example of FIG. 3, the transistors indicated by "64" (e.g., the fifth transistor 312) may correspond to the "fixed" portions described with reference to FIGS. 1 and 2 (i.e., the portions 134, 144, 146, 156) and may therefore be gated "on" with a logically high voltage. For example, gates of the transistors indicated by "64" may be tied to a power supply voltage to maintain the gates activated during operation of the analog correction circuit 300. As will be appreciated, the specific configuration of the analog correction circuit 300 will depend on the particular application (e.g., an expected amount of phase imbalance between I and Q input signals), which may be similar to or different than the particular example illustrated in FIG. 3. As a particular example, the scale of the transistors indicated by "64" in FIG. 3 may be greater than 64 in applications where the expected phase imbalance is expected to be less than approximately 80 percent. Similarly, the scale of the transistors indicated by "64" may be less than 64 in applications where the expected phase imbalance is expected to be greater than approximately 80 percent.

In operation, transistors of the analog correction circuit 300 may be selectively activated (e.g., selectively gated) with suitable control signals to calibrate the input signals 102, 104, 106, 108 (e.g., to correct a relative phase imbalance between I and Q input signals at the input nodes 118, 120, 122, 124). Selectively activating the transistors of the analog correction circuit 300 may generate balanced currents at the output nodes 110, 112, 114, 116 (e.g., by allocating or "steering" current to or away from the output nodes 110, 112, 114, 116 in response to a phase imbalance between the input signals 102, 104, 106, 108). That is, magnitudes of currents associated with I and Q components of the output signals 126, 128, 130, 132 may exhibit a 90° or approximately a 90° phase relation. In a particular embodiment, transistors of the analog correction circuit 300 are selectively activated to correct, or at least improve, the phase imbalances $I_{imb}$ and $Q_{imb}$ using the calibration matrix described above. That is, output signals at the output nodes 110, 112, 114, 116 may be phase-corrected according to the calibration matrix described above. The transistors may be selectively gated by control logic (omitted in FIG. 3 for clarity of illustration) that is configured to determine $I_{imb}$ and $Q_{imb}$ as described above. The control logic may use a conventional technique to determine $I_{imb}$ and $Q_{imb}$ and may use the analog correction circuit to apply the calibration matrix to correct or reduce $I_{imb}$ and $Q_{imb}$.

As will be appreciated, selective activation of the transistors to steer current to or away from the output nodes 110, 112, 114, 116 may correspond to (or may implement) the analog processing techniques described above with reference to FIGS. 1 and 2. Because the analog correction circuit 300 of FIG. 3 uses multiple transistors to adjust I-Q phase imbalances, digital circuitry (e.g., a digital baseband processor) may be freed to perform other tasks. Utilizing multiple transistors to adjust I-Q phase imbalances may be less complex than digital techniques (e.g., digital pre-distortion) and may be faster (e.g., closer to "real-time") than such digital techniques. Further, because current magnitudes may be easily adjusted (e.g., by adding or subtracting current, such as by "steering" current to or away from a node as described above using an analog processing technique), implementation of the analog correction circuit 300 may be simplified as compared to conventional devices (e.g., devices that use complex digital correction techniques to adjust I-Q phase imbalances).

In at least one embodiment, the I input nodes 118, 120 correspond to a pair of differential I input nodes. The I input signals 102, 104 may correspond to a differential pair of I input signals. Further, the Q input nodes 122, 124 may correspond to a pair of differential Q input nodes and the Q input signals 106, 108 may correspond to a pair of differential Q input signals. In addition, the I output nodes 110, 112, the I output signals 126, 128, the Q output nodes 114, 116, and the Q output signals 130, 132 may correspond to a pair of differential I output nodes, a pair of differential I output signals, a pair of differential Q output nodes, and a pair of differential Q output signals, respectively.

Figure 4:
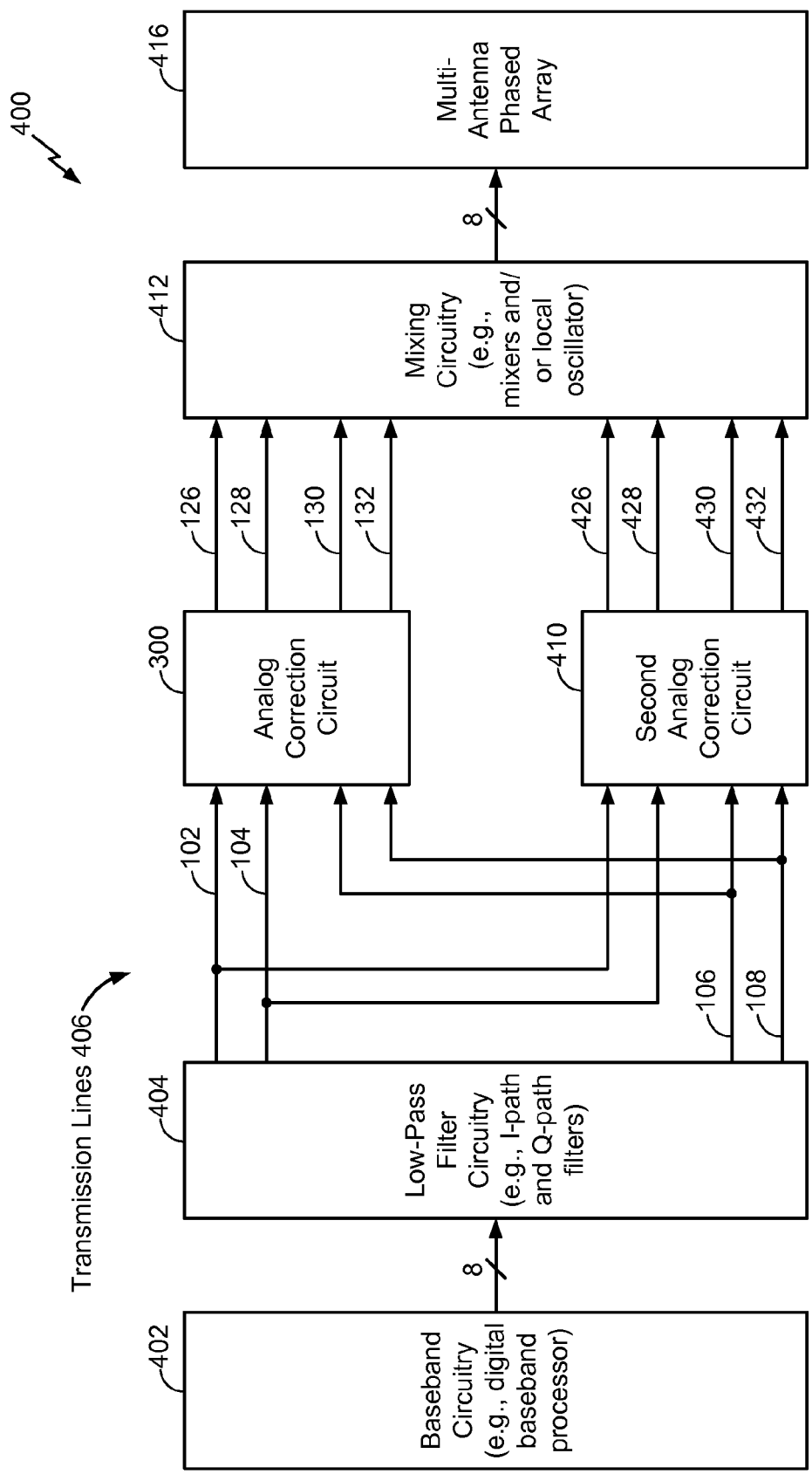
FIG. 4 is a diagram of a particular illustrative embodiment of an apparatus that includes the analog correction circuit of FIG. 3.

Referring to FIG. 4, a particular illustrative embodiment of an apparatus (e.g., a transmitter) is depicted and generally designated 400. The apparatus 400 includes the analog correction circuit 300 of FIG. 3. The apparatus 400 further includes baseband circuitry 402, low-pass filter circuitry 404

(e.g., I-path and Q-path filters), transmission lines 406, a second analog correction circuit 410, mixing circuitry 412 (e.g., mixers and/or a local oscillator (LO)), and a multi-antenna phased array 416.

In operation, the baseband circuitry 402 may generate one or more signals, such as signals corresponding to information to be transmitted from the apparatus 400 to another device. The baseband circuitry 402 may convert the signals into the analog domain, such as by using a digital-to-analog converter (DAC). The low-pass filter circuitry 404 may low-pass filter the analog domain signals to generate the input signals 102, 104, 106, and 108.

The transmission lines 406 may provide the input signals 102, 104, 106, and 108 to the analog correction circuits 300, 410. The analog correction circuit 300 may generate the output signals 126, 128, 130, and 132. The second analog correction circuit 410 may generate output signals 426, 428, 430, and 432. Operation of the analog correction circuits 300, 410 may correspond to the particular example operation described in connection with the analog correction circuit 300 of FIG. 3.

The mixing circuitry 412 may mix the output signals 126, 128, 130, 132, 426, 428, 430, 432 (e.g., based on a local oscillator (LO) signal) to generate a plurality of I-Q calibrated radio frequency (RF) signals. The multi-antenna phased array 416 may transmit signals responsive to the plurality of I-Q calibrated RF signals. Although FIG. 4 depicts that the analog correction circuit 300 is implemented in a transmitter architecture, it should be appreciated that according to further embodiments, the analog correction circuit 300 may be included in a receiver or a transceiver.

The apparatus 400 described with reference to FIG. 4 may enable simplified correction of I-Q phase imbalances. For example, because the analog correction circuits 300, 410 may calibrate I and Q input signals in the analog domain (e.g., after processing performed by the baseband circuitry 402), use of a costly image rejection filter may be avoided. Other computationally complex techniques, such as digital "pre-distortion" by a digital processor or "offline" digital calibration techniques, may likewise be avoided.

Figure 5:
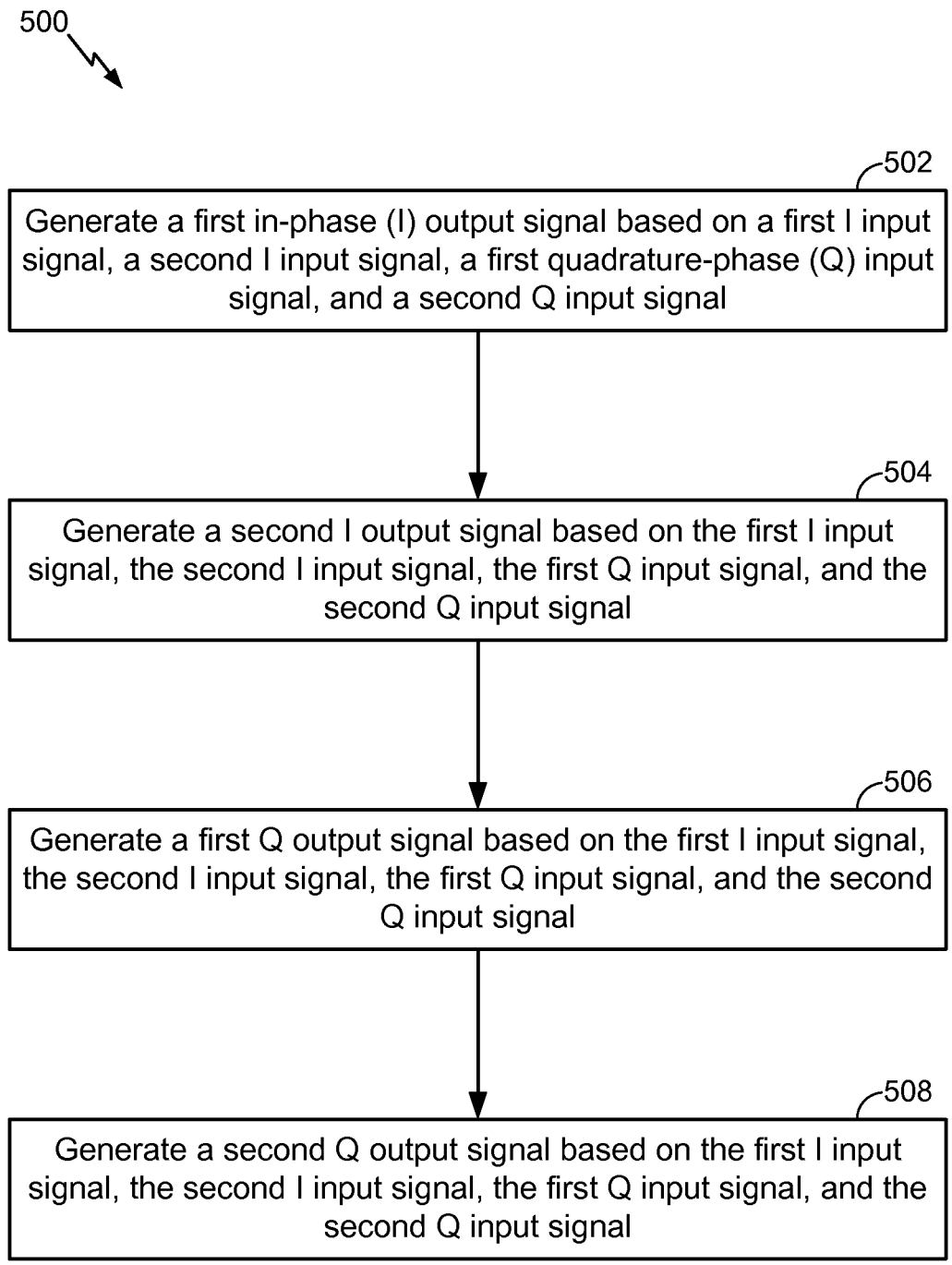
FIG. 5 is a flow chart of a particular illustrative embodiment of a method of generating in-phase (I) and quadrature-phase (Q) signals.

Referring to FIG. 5, a flow chart of a particular illustrative embodiment of a method of generating in-phase (I) and quadrature-phase (Q) signals is depicted and generally designated 500. The method 500 may be performed at an analog correction circuit, such as the analog correction circuit 300, the analog correction circuit 410, or a combination thereof.

The method 500 includes generating a first I output signal based on a first I input signal, a second I input signal, a first Q input signal, and a second Q input signal, at 502. The first I output signal, the first I input signal, and the second I input signal may correspond to the first I output signal 126, the first I input signal 102, and the second I input signal 104, respectively. The first I output signal may be generated using one or more transistors, such as the transistors 302, 324, 328, 340, as described with reference to FIG. 3.

At 504, the method 500 further includes generating a second I output signal based on the first I input signal, the second I input signal, the first Q input signal, and the second Q input signal. The second I output signal may correspond to the second I output signal 128. The second I output signal may be generated using one or more transistors, such as the transistors 314, 326, 330, 342, as described with reference to FIG. 3.

At 506, the method 500 further includes generating a first Q output signal based on the first I input signal, the second I input signal, the first Q input signal, and the second Q input signal. The first Q output signal, the first Q input signal, and the second Q input signal may correspond to the first Q output signal 130, the first Q input signal 106, and the second Q input signal 108. The first Q output signal may be generated using one or more transistors, such as the transistors 316, 320, 332, 336, as described with reference to FIG. 3.

At 508, the method 500 further includes generating a second Q output signal based on the first I input signal, the second I input signal, the first Q input signal, and the second Q input signal. The second Q output signal may correspond to the second Q output signal 132. The second Q output signal may be generated using one or more transistors, such as the transistors 318, 322, 334, 338, as described with reference to FIG. 3.

In at least one embodiment, the method 500 of FIG. 5 describes a simplified I-Q calibration technique. For example, the method 500 of FIG. 5 may be implemented using an analog correction circuit, such as the analog correction circuit 300, instead of digital circuitry, such as a digital processor.

Figure 6:
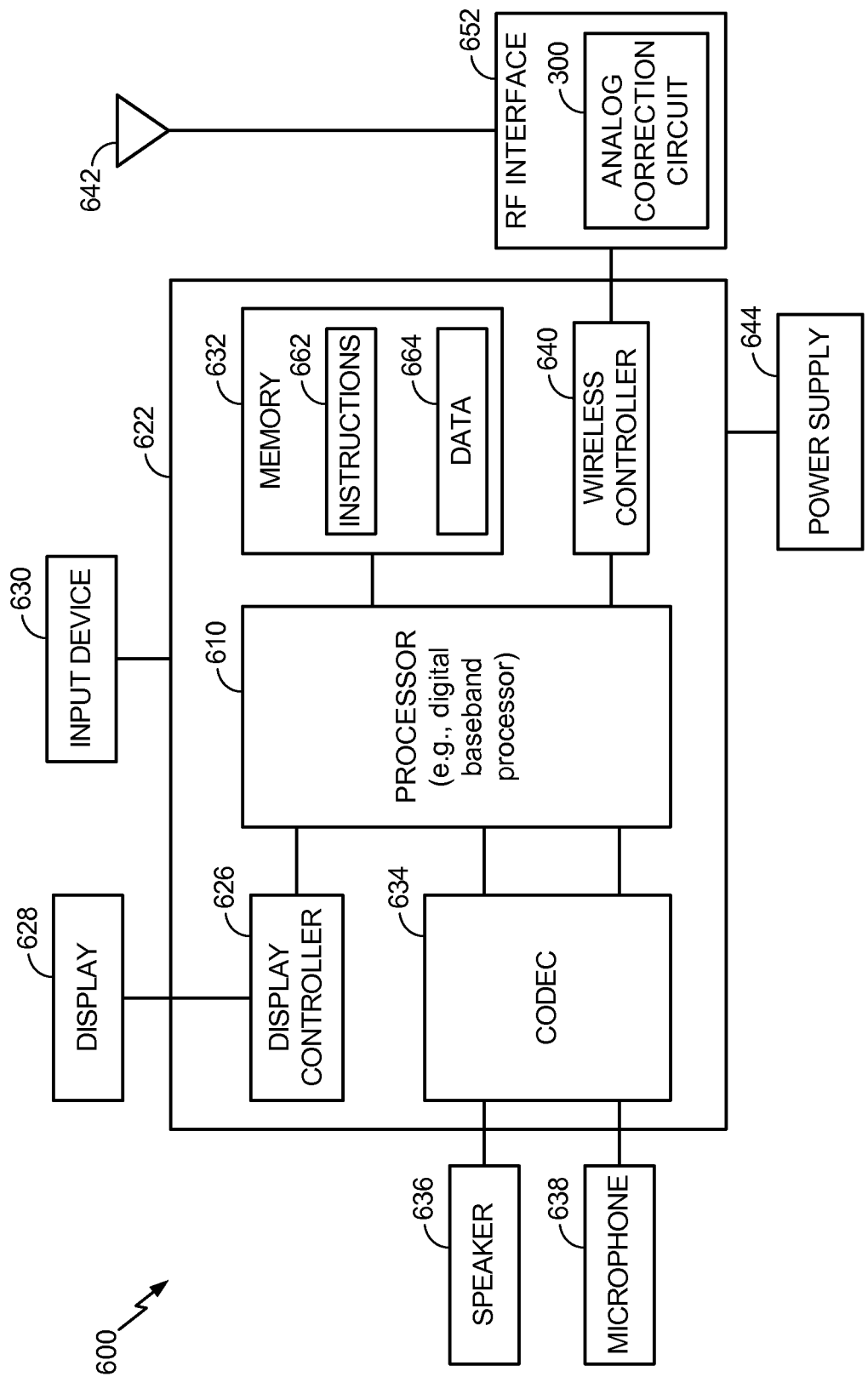
FIG. 6 is a diagram of an illustrative embodiment of a device including the analog correction circuit of FIG. 3.

Referring to FIG. 6, a block diagram of a particular illustrative embodiment of a device is depicted and generally designated 600. One or more components and operations described with reference to FIG. 6 may be implemented in a mobile device (e.g., a wireless telephone), a modem, such as a high-speed local area network (LAN) modem that utilizes a 60 gigahertz (GHz) frequency spectrum, or a combination thereof. In at least one embodiment, the modem complies with an Institute of Electrical and Electronics Engineers (IEEE) 802.11 communication protocol, such as an IEEE 802.11ad communication protocol.

The device 600 may include a processor 610, such as a digital baseband processor. The processor 610 may be coupled to a computer-readable storage medium, such as a memory 632 (e.g., a non-transitory computer-readable medium). The memory 632 may store instructions 662 that are executable by the processor 610. The memory 632 may store data 664 that is accessible to the processor 610.

FIG. 6 also shows a display controller 626 that is coupled to the processor 610 and to a display 628. A coder/decoder (CODEC) 634 can also be coupled to the processor 610. A speaker 636 and a microphone 638 can be coupled to the CODEC 634. FIG. 6 also indicates that a wireless controller 640 can be coupled to the processor 610. The wireless controller 640 may be further coupled to an antenna 642 via a radio frequency (RF) interface 652 (e.g., circuitry, such as a transceiver circuit, that is configured to interface between baseband and RF signals).

As depicted in FIG. 6, the RF interface 652 may include the analog correction circuit 300. Because the analog correction circuit 300 calibrates I and Q signals (e.g., the input signals 102, 104, 106, 108), the processor 610 may perform other tasks instead of performing I-Q calibration. For example, conventional techniques such as "pre-distortion" and non-real time calibration may be avoided.

In a particular embodiment, the processor 610, the display controller 626, the memory 632, the CODEC 634, and the wireless controller 640 are included in a system-in-package or system-on-chip device 622. An input device 630 and a power supply 644 may be coupled to the system-on-chip device 622. Moreover, in a particular embodiment, and as illustrated in FIG. 6, the display 628, the input device 630, the speaker 636, the microphone 638, the antenna 642, the RF interface 652, and the power supply 644 are external to the system-on-chip device 622. However, each of the display 628, the input device 630, the speaker 636, the microphone 638, the antenna 642, the RF interface 652, and the power supply 644 can be coupled to a component of the system-on-chip device 622, such as to an interface or to a controller.

In operation, the processor 610 may execute the instructions 662 to cause the RF interface 652 to send and receive signals using the analog correction circuit 300. For example, in at least one embodiment, the instructions 662 are executable by the processor 610 to cause the processor 610 to generate a first in-phase (I) input signal, a second I input signal, a first quadrature-phase (Q) input signal, and a second Q input signal (e.g., the input signals 102, 104, 106, 108, respectively). The instructions 662 may be further executable by the processor 610 to cause the processor 610 to provide the first I input signal, the second I input signal, the first Q input signal, and the second Q input signal to the RF interface 652. In response, the RF interface 652 generates a first I output signal (e.g., the first I output signal 126) based on the first I input signal, the second I input signal, the first Q input signal, and the second Q input signal. The RF interface 652 further generates a second I output signal (e.g., the second I output signal 128) based on the first I input signal, the second I input signal, the first Q input signal, and the second Q input signal. The RF interface 652 further generates a first Q output signal (e.g., the first Q output signal 130) based on the first I input signal, the second I input signal, the first Q input signal, and the second Q input signal. The RF interface 652 further generates a second Q output signal (e.g., the second Q output signal 132) based on the first I input signal, the second I input signal, the first Q input signal, and the second Q input signal.

In at least one embodiment, the processor 610 executes the instructions 662 to determine $I_{imb}$ and $Q_{imb}$, as described above in accordance with a conventional technique. The processor 610 may generate control signals to control the analog correction circuit 300 (e.g., by selectively activating gates of transistors of the analog correction circuit 300) to correct or reduce I-Q phase imbalances according to the correction matrix described above. Further, the processor 610 may calibrate the I and Q input signals by accessing a code stored at the memory 632. For example, the data 664 may include a plurality of digital codes each corresponding to a particular combination of transistors to be activated (e.g., gated on) at the analog correction circuit 300. The processor 610 may execute the instructions 662 to calibrate the analog correction circuit 300 by selecting from (e.g., "cycling through") the plurality of digital codes to determine which of the plurality of digital codes achieves better I-Q calibration performance than other codes of the plurality of digital codes. According to various embodiments, the processor 610 may access the plurality of digital codes to calibrate the analog correction circuit 300 during fabrication of the device 600 (e.g., "at the factory"), upon startup of the device 600, duration operation of the device 600 (e.g., "dynamically"), or a combination thereof.

Although FIG. 6 depicts a single analog correction circuit (i.e., the analog correction circuit 300), according to other embodiments, the RF interface 652 may include additional analog correction circuits. For example, the RF interface 652 may include the second analog correction circuit 410 of FIG. 4. Further, although FIG. 6 depicts a single antenna (i.e., the antenna 642), according to other embodiments, the device 600 may include multiple antennas, which may correspond to the multi-antenna phased array 416 of FIG. 4. The RF interface 652 may include one or more other components, such as the low-pass filter circuitry 404 of FIG. 4, the transmission lines 406 of FIG. 4, the mixing circuitry 412 of FIG. 4, or a combination thereof. In at least one embodiment, the processor 610 of FIG. 6 corresponds to the baseband circuitry 402 of FIG. 4.

In connection with the embodiments described herein, an apparatus includes means for allocating (e.g., the transistors 302, 314) a first in-phase (I) input signal between a first I output node and a second I output node. The first I input signal may correspond to the first I input signal 102. The first I output node and the second I output node may correspond to the I output nodes 110, 112, respectively. The apparatus further includes means for allocating (e.g., the transistors 328, 330) a second I input signal between the first I output node and the second I output node. The second I input signal may correspond to the second I input signal 104. The apparatus further includes means for allocating (e.g., the transistors 320, 322) a first quadrature-phase (Q) input signal between a first Q output node and a second Q output node. The first Q input signal may correspond to the first Q input signal 106. The first Q output node and the second Q output node may correspond to the Q output nodes 114, 116, respectively. The apparatus further includes means for allocating (e.g., the transistors 336, 338) a second Q input signal between the first Q output node and the second Q output node. The second Q input signal may correspond to the second Q input signal 108.

In at least one embodiment, the apparatus further includes means for allocating (e.g., the transistors 316, 318) the first I input signal between the first Q output node and the second Q output node and means for allocating (e.g., the transistors 332, 334) the second I input signal between the first Q output node and the second Q output node. The apparatus may further include means for allocating (e.g., the transistors 324, 326) the first Q input signal between the first I output node and the second I output node and means for allocating (e.g., the transistors 340, 342) the second Q input signal between the first I output node and the second I output node.

Those of skill in the art will appreciate that the foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are then cut into semiconductor die and packaged into a semiconductor chip. The chips are then employed in devices described above.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of generating in-phase (I) and quadrature-phase (Q) signals, the method comprising:
   generating a first I output signal based on a first I input signal, a second I input signal, a first Q input signal, and a second Q input signal;
   generating a second I output signal based on the first I input signal, the second I input signal, the first Q input signal, and the second Q input signal;
   generating a first Q output signal based on the first I input signal, the second I input signal, the first Q input signal, and the second Q input signal; and
   generating a second Q output signal based on the first I input signal, the second I input signal, the first Q input signal, and the second Q input signal;
   wherein generating the first and second I output signals and the first and second Q output signals comprises using one or more analog correction circuits to adjust for a relative phase imbalance between:
      the first and second I input signals; and
      the first and second Q input signals.

2. The method of claim 1, wherein generating the first I output signal, generating the second I output signal, generating the first Q output signal, and generating the second Q output signal satisfies a the first balance condition.

3. The method of claim 2, wherein the first balance condition specifies that allocating the first I input signal and the second I input signal to a first I output node and to a second I output node is balanced with respect to allocating the first Q input signal and the second Q input signal to a first Q output node and to a second Q output node.

4. The method of claim 1, wherein generating the first I output signal, generating the second I output signal, generating the first Q output signal, and generating the second Q output signal satisfies a second balance condition.

5. The method of claim 4, wherein the second balance condition specifies that allocating the first I input signal and the second I input signal to a first Q output node and to a second Q output node is balanced with respect to allocating the first Q input signal and the second Q input signal to a first I output node and to a second I output node.

6. The method of claim 5, wherein the first I output node and the second I output node correspond to a differential I output, and wherein the first Q output node and the second Q output node correspond to a differential Q output.

7. A computer-readable storage medium storing instructions that are executable by a processor to cause the processor to:
   generate a first in-phase (I) input signal, a second I input signal, a first quadrature-phase (Q) input signal, and a second Q input signal; and
   provide the first I input signal, the second I input signal, the first Q input signal, and the second Q input signal to a radio frequency (RF) interface to:
      generate a first I output signal based on the first I input signal, the second I input signal, the first Q input signal, and the second Q input signal;
      generate a second I output signal based on the first I input signal, the second I input signal, the first Q input signal, and the second Q input signal;
      generate a first Q output signal based on the first I input signal, the second I input signal, the first Q input signal, and the second Q input signal; and
      generate a second Q output signal based on the first I input signal, the second I input signal, the first Q input signal, and the second Q input signal;
   wherein generating the first and second I output signals and the first and second Q output signals comprises using the RF interface to adjust for a relative phase imbalance between:
      the first and second I input signals; and
      the first and second Q input signals.

8. An apparatus for generating in-phase (I) and quadrature-phase (Q) signals, the apparatus comprising one or more analog correction circuits for:
   generating a first I output signal based on a first I input signal, a second I input signal, a first Q input signal, and a second Q input signal;
   generating a second I output signal based on the first I input signal, the second I input signal, the first Q input signal, and the second Q input signal;
   generating a first Q output signal based on the first I input signal, the second I input signal, the first Q input signal, and the second Q input signal; and
   generating a second Q output signal based on the first I input signal, the second I input signal, the first Q input signal, and the second Q input signal;
   wherein generating the first and second I output signals and the first and second Q output signals comprises using the analog correction circuits to adjust for a relative phase imbalance between:
      the first and second I input signals; and
      the first and second Q input signals.

9. The method of claim 1, wherein the first and second I output signals and the first and second Q output signals are mixed with one or more local oscillator (LO) signals.

* * * * *